US011112475B2

(12) United States Patent
Jurrissen et al.

(10) Patent No.: US 11,112,475 B2
(45) Date of Patent: Sep. 7, 2021

(54) PARALLEL MULTI-SLICE MR IMAGING

(71) Applicant: KONINKLIJKE PHILIPS N.V., Eindhoven (NL)

(72) Inventors: Michel Paul Jurriaan Jurrissen, Best (NL); Arthur Filipe Nisti Grigoletto Borgonovi, Eindhoven (NL); Thomas Hendrik Rozijn, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 37 days.

(21) Appl. No.: 16/618,959

(22) PCT Filed: Jun. 8, 2018

(86) PCT No.: PCT/EP2018/065194
§ 371 (c)(1),
(2) Date: Dec. 3, 2019

(87) PCT Pub. No.: WO2018/224661
PCT Pub. Date: Dec. 13, 2018

(65) Prior Publication Data
US 2020/0088822 A1    Mar. 19, 2020

(30) Foreign Application Priority Data

Jun. 9, 2017    (EP) .................................... 17175156

(51) Int. Cl.
*G01R 33/483*    (2006.01)
*G01R 33/561*    (2006.01)
*G01R 33/565*    (2006.01)

(52) U.S. Cl.
CPC ...... *G01R 33/4835* (2013.01); *G01R 33/5611* (2013.01); *G01R 33/56545* (2013.01)

(58) Field of Classification Search
CPC ............ G01R 33/4835; G01R 33/5611; G01R 33/56545; G01R 33/5616; G01R 33/56509
See application file for complete search history.

(56) References Cited

U.S. PATENT DOCUMENTS 7,408,345 B2    8/2008    Bammer et al.
7,977,943 B2 *  7/2011    Marinelli ........... G01R 33/5611
                                                        324/309

(Continued)

FOREIGN PATENT DOCUMENTS

WO    2012054768 A1    4/2012

OTHER PUBLICATIONS

Larkman et al "Use of Multicoil Arrays for Separation of Signal from Multiple Slices Simultaneously Excited" Journal of Magnetic Resonance Imaging, 13 p. 313-317 (2001).

(Continued)

*Primary Examiner* — Susan S Lee

(57) ABSTRACT

A method of magnetic resonance (MR) imaging of an object includes: generating MR signals by subjecting the object to a number N of shots of a multi-echo imaging sequence comprising multi-slice RF pulses for simultaneously exciting two or more spatially separate image slices, with a phase offset in the slice direction being imparted to the MR signals; acquiring the MR signals that are received in parallel via a set of at least two RF coils having different spatial sensitivity profiles; and reconstructing a MR image for each image slice from the acquired MR signals using a parallel reconstruction algorithm, wherein the MR signal contributions from the different image slices are separated on the basis of the spatial encodings of the MR signals according to the spatial sensitivity profiles of the RF coils and of the phase offsets attributed to the respective image slices and shots.

13 Claims, 2 Drawing Sheets

(56) References Cited

U.S. PATENT DOCUMENTS

| | | | |
|---|---|---|---|
| 9,897,675 B2* | 2/2018 | Setsompop | G01R 33/50 |
| 10,151,819 B2* | 12/2018 | Choi | A61B 5/026 |
| 10,241,184 B2 | 3/2019 | Jurrissen et al. | |
| 2014/0002078 A1 | 1/2014 | Chen et al. | |
| 2014/0225612 A1 | 8/2014 | Polimeni et al. | |
| 2015/0115958 A1 | 4/2015 | Wang et al. | |
| 2015/0154741 A1 | 6/2015 | Chen et al. | |
| 2015/0168526 A1 | 6/2015 | Kang et al. | |
| 2015/0301145 A1 | 10/2015 | Kerr et al. | |
| 2016/0018499 A1 | 1/2016 | Bornert et al. | |
| 2018/0038932 A1 | 2/2018 | Arunachalam | |

OTHER PUBLICATIONS

Breuer et al "Controlled aliasing in parallel imaging results in higher acceleration (CAIPIRINHA) for multi-slice imaging" Magnetic Resonance in Medicine 53 p. 684-691 2005.

Jeoung et al "High Resolution Human Diffusion Tensor Imaging Using 2-d Navigated Multishot . . . " Magnetic Resonance in Med. 2013 vol. 69 p. 793-802.

Glover et al "Phase-offset multiplanar (POMP) volume imaging: A new technique" Journal of Magnetic Resonance Imaging, p. 457-461 (1991).

International Search Report and Written Opinion from PCT/EP2018/065194 dated Sep. 12, 2018.

Ma et al "Improved Multi-shot Diffusion Imaging using GRAPPA with a Compact Kernel" Neuroimage, 138 p. 88-99 2016.

\* cited by examiner

PARALLEL MULTI-SLICE MR IMAGING

CROSS REFERENCE TO RELATED APPLICATIONS

This application is a U.S. national phase application of International Application No. PCT/EP2018/065194 filed on Jun. 8, 2018, which claims the benefit of EP Application Serial No. 17175156.3 filed on Jun. 9, 2017 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils. To realize spatial resolution in the body, constant magnetic field gradients extending along the three main axes are superposed on the uniform magnetic field, leading to a linear spatial dependency of the spin resonance frequency. The signal picked up in the receiving coils then contains components of different frequencies which can be associated with different locations in the body.

The signal data obtained via the receiving coils corresponds to the spatial frequency domain and is called k-space data. The k-space data usually includes multiple lines acquired with different phase encoding. Each line is digitized by collecting a number of samples. A set of k-space data is converted to a MR image by means of an image reconstruction algorithm.

Parallel acquisition techniques are commonly applied for accelerating MR acquisition. Methods in this category are SENSE (Sensitivity Encoding), SMASH (Simultaneous Acquisition of Spatial Harmonics), and GRAPPA (Generalized Auto-calibrating Partially Parallel Acquisition). SENSE, SMASH, and GRAPPA and other parallel acquisition techniques use under-sampled k-space data acquisition obtained from multiple RF receiving coils in parallel. In the corresponding reconstruction algorithms, the (complex) signal data from the multiple coils are combined with complex weightings in such a way as to suppress under-sampling artifacts (aliasing) in the finally reconstructed MR images. This type of complex array signal combination is sometimes referred to as spatial filtering, and includes combining which is performed in the k-space domain (as in SMASH and GRAPPA) or in the image domain (as in SENSE), as well as methods which are hybrids.

Larkman et al. (Journal of Magnetic Resonance Imaging, 13, 313-317, 2001) proposed to apply sensitivity encoding also in the slice direction in case of multi-slice imaging to increase scan efficiency. Breuer et al. (Magnetic Resonance in Medicine, 53, 684-691, 2005) improved this basic idea proposing an approach termed "controlled aliasing in parallel imaging results in higher acceleration" (CAIPIRINHA). This technique modifies the appearance of aliasing artifacts in each individual slice during the multi-slice acquisition by imparting a phase offset to the MR signals of each image slice, thereby improving the subsequent parallel image reconstruction procedure. Thus, CAIPIRINHA is a parallel multi-slice imaging technique which is more efficient compared to other multi-slice parallel imaging concepts that use only a pure post-processing approach. In CAIPIRINHA, multiple slices of arbitrary thickness and distance are excited simultaneously using phase-modulated multi-slice RF pulses (similar to the known Hadamard pulses). The acquired MR signal data are under-sampled, yielding superimposed slice images that appear shifted with respect to each other corresponding to the different phase offsets. The shift of the aliased slice images is controlled by the phase offsets applied by the phase-modulation scheme of the RF pulses in accordance with the Fourier shift theorem. The numerical conditioning of the inverse reconstruction problem, separating the individual signal contributions of the involved slices, is improved by using this shift.

US 2014/0225612 A1 discloses a method for MR imaging using a segmented echo planar imaging (EPI) pulse sequence. The pulse sequence includes multiple multi-slice RF pulses for simultaneously exciting two or more spatially separate image slices. A particular gradient encoding scheme is applied along the slice-encoding direction to impart controlled phase offsets to the different slices. The acquired MR signal data is reconstructed into MR images using a parallel imaging reconstruction method that separates the overlapping slices in the imaging data to provide a series of MR images for each of the slices across the imaged object.

US 2016/0018499 A1 addresses the problem that CAIPIRINHA uses a fixed phase-modulation scheme of the RF pulses, resulting in a relative shift of adjacent slices by, for example, half the dimension of the field-of-view (FOV) or some other integer fraction of the dimension of the FOV. A drawback of this fixed scheme is that it does not take a-priori information into account. Thus, the encoding capabilities of the array of receiving RF coils and also the basic structure of the imaging problem are not sufficiently considered which may result in a sub-optimal phase-modulation and consequently in sub-optimal reconstruction performance. As a solution of this problem, US 2016/0018499 A1 proposes to use the available coil sensitivity information to derive adjusted slice specific phase offsets to further optimize the encoding process and, thus, the conditioning of the unfolding problem in order to improve the final image quality.

SUMMARY OF THE INVENTION

In accordance with the invention, a method of MR imaging of an object placed in an examination volume of a MR device is disclosed. The method comprises the steps of:
generating MR signals by subjecting the object to a number N of shots of a multi-echo imaging sequence comprising multi-slice RF pulses for simultaneously exciting two or more spatially separate image slices, with a phase offset in the slice direction being imparted to the MR signals of each image slice, wherein the phase offset is varied from shot to shot,
acquiring the MR signals, wherein the MR signals are received in parallel via a set of at least two RF coils having different spatial sensitivity profiles within the examination volume, and
reconstructing a MR image for each image slice from the acquired MR signals using a parallel reconstruction algorithm, wherein the MR signal contributions from the different image slices are separated on the basis of the spatial encodings of the MR signals according to the spatial sensitivity profiles of the RF coils and on the basis of the phase offsets attributed to the respective image slices and shots.

The method of the invention uses a multi-shot multi-echo imaging sequence to improve the image resolution and/or reduce geometrical distortions and/or increase the signal-to-noise ratio (SNR) in comparison to (single-shot) EPI scans. According to the invention, the multi-slice phase offset is varied on a shot-to-shot basis. In this way, an extra phase encoding can be applied in a flexible fashion in the slice direction which improves the stability of the separation of the slice images in the reconstruction step.

The invention uses a parallel imaging reconstruction algorithm (such as, e.g., SENSE or SMASH reconstruction) for the separation of the MR signal contributions from the different image slices. The imaging signal data acquired in each shot of the multi-echo imaging sequence is a subset of full k-space modulated according to the different phase offsets applied in the slice direction. The parallel image reconstruction algorithm is used to produce full (unfolded) slice images from the signal data. The MR signals are acquired in parallel via the different RF coils ('channels'), preferably with under-sampling in the phase-encoding direction to speed up the acquisition. This is taken into account in the conventional fashion during image reconstruction by the parallel reconstruction algorithm. The phase offsets applied in the slice direction between the shots are taken into account by additionally incorporating the corresponding phase information into the encoding matrix on which the parallel reconstruction algorithm is based. In other words, the inverse problem of image reconstruction is solved according to the invention using an encoding matrix of which the matrix elements are determined not only by the spatial sensitivity profiles of the RF coils and the k-space sampling pattern of each shot of the imaging sequence but also by the different phase offsets attributed to the image slices and shots. This approach is comparable to the known IRIS (Image Reconstruction using Image-space Sampling functions) reconstruction scheme known for efficient image reconstruction in multi-shot multi-echo SENSE imaging (see Jeoung et al. in Magnetic Resonance in Medicine 2013, volume 69, pages 793-802) with the difference that the concept is expanded to multi-slice imaging by considering not only a single MR image but a number of image slices and by incorporating the corresponding phase information into the encoding matrix.

The imaging sequence of the method of the invention is a multi-shot sequence which entails that k-space is sampled in a segmented fashion. In other words, only a sub-set of k-space is sampled in each shot of the imaging sequence. Notably, wherein k-space data under-sampled in a phase-encoding direction imparted by the varying phase offsets are acquired.

In a possible embodiment, the variable phase offsets may be imparted by means of a phase modulation of the RF pulses (like, for example, in the known POMP technique, see Glover et al., Journal of Magnetic Resonance Imaging 1991, pages 457-461). Alternatively, magnetic field gradients applied in a slice-selection direction may be used for imparting the phase offsets (like in the above-cited US 2014/0225612 A1).

The MR signals acquired in the different shots of the imaging sequence may contain different phase errors, e.g. due to heating of gradient coils or due to motion of the imaged object in the presence of diffusion gradients. If these phase errors are a-priori known, they can be taken into account by the method of the invention by incorporating the corresponding phase error values into the encoding matrix. Similarly, odd and even echo signals (acquired in the presence of readout magnetic field gradients of opposed polarities) can contain systematic phase errors, for example due to different delays of the opposite gradients. By splitting the train of echo signals of each full shot in two MR signal data sets, one comprising the odd echo signals and the other one comprising the even echo signals, the number of shots is virtually doubled from the perspective of the reconstruction algorithm. This enables to correct for the odd/even echo phase errors by incorporating the corresponding phase error values into the encoding matrix.

In order to take motion of the imaged object into account, motion information may be gathered from the imaged object, for example by using a respiratory belt during acquisition, wherein a motion weighting based on the motion information is applied in the MR image reconstruction. MR signal data acquired in the presence of strong motion are attributed a reduced weighting in comparison to the MR signal data acquired with less motion.

Navigator signals may be generated by subjecting the object to a navigator sequence between the shots of the imaging sequence. A motion weighting derived from the navigator signals may then be applied in the MR image reconstruction. Alternatively, analogous to the known IRIS approach, the motion-induced shot-to-shot phase errors can be taken into account by directly incorporating the corresponding phase information derived from the navigator signals into the encoding matrix.

In another preferred embodiment of the method of the invention, a number M<N of shots of the imaging sequence may be performed two or more times for the purpose of improving the SNR. Instead of repeating the complete acquisition to increase the SNR via averaging, it is also possible to repeat only a sub-set of the total number of N shots. The corresponding MR signals can then be added to the parallel reconstruction scheme of the invention. These additional shots may employ different phase offsets than the other shots of the imaging sequence in order to further improve the stability of the reconstruction algorithm.

The method of the invention described thus far can be carried out by means of a MR device including at least one main magnet coil for generating a uniform static magnetic field within an examination volume, a number of gradient coils for generating switched magnetic field gradients in different spatial directions within the examination volume, a set of RF coils for receiving MR signals from the body in parallel, the RF coils having different spatial sensitivity profiles, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
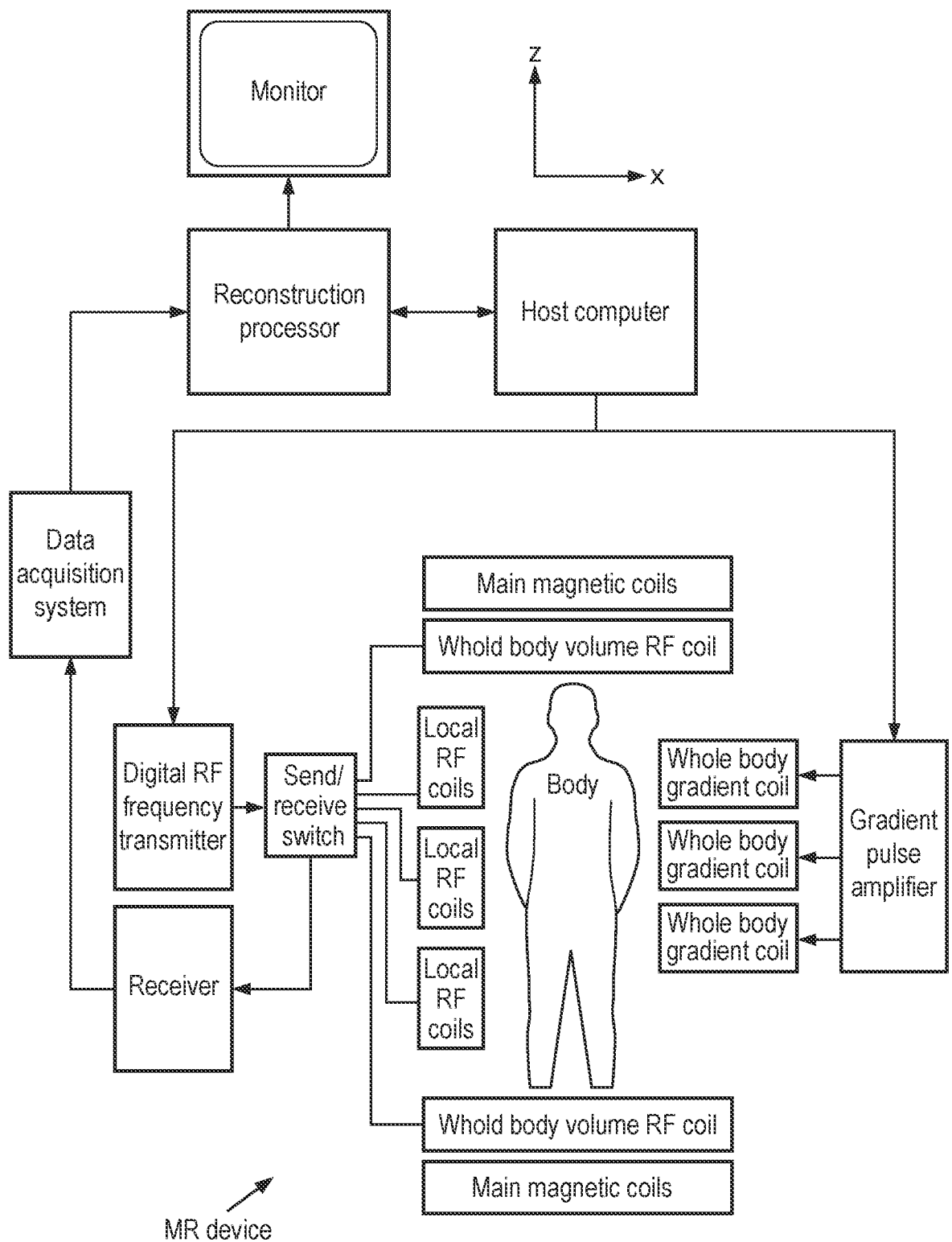
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume.

For generation of MR images of limited regions of the body 10 by means of parallel imaging, a set of local RF coils 11, 12, 13 having different spatial sensitivity profiles are placed contiguous to the region selected for imaging.

The resultant MR signals are picked up by the RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 and the reconstruction processor 17 are programmed to execute the method of the invention as described above and in the following.

Figure 2:
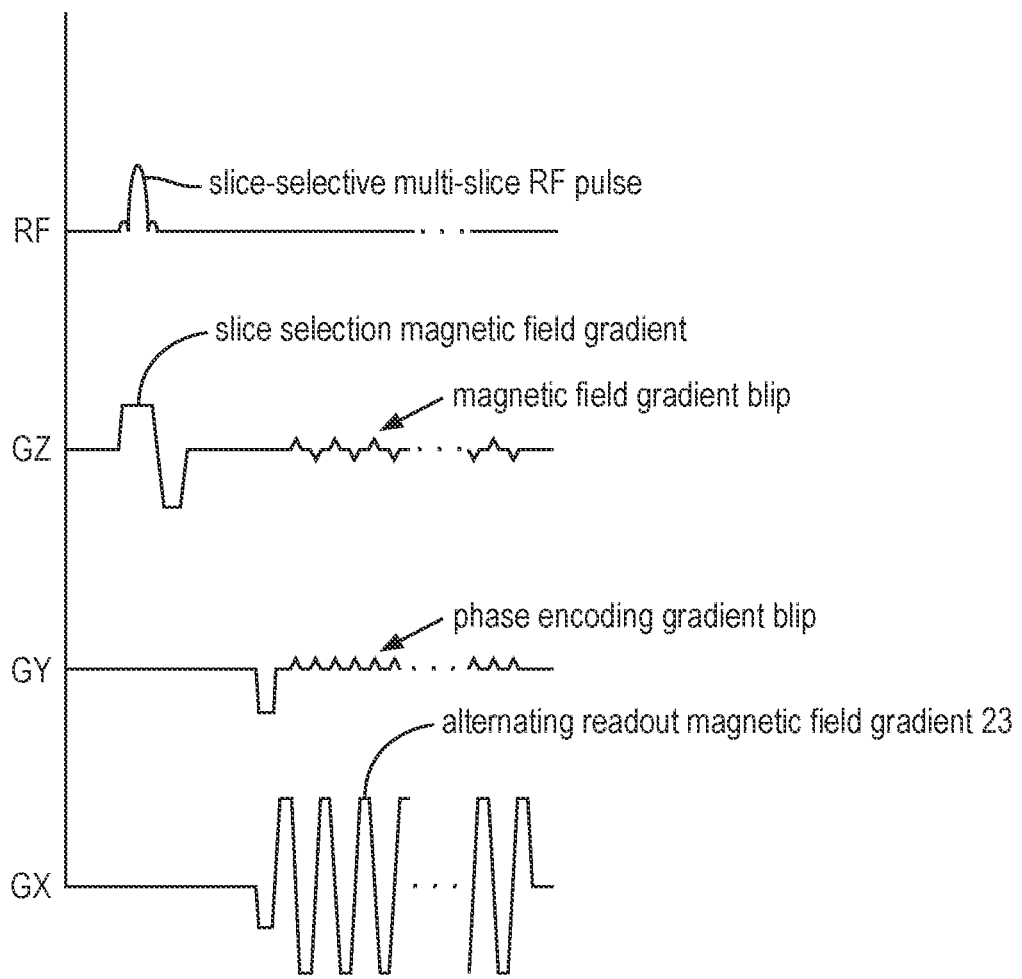
FIG. 2 illustrates one shot of the multi-shot multi-echo imaging sequence employed according to the invention.
Figure 3:
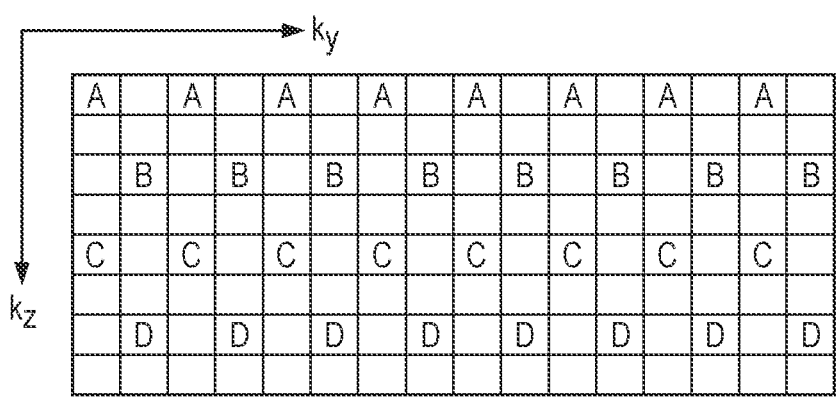
FIG. 3 schematically illustrates the k-space encoding scheme applied in accordance with the invention.

With continuing reference to FIG. 1 and with further reference to FIGS. 2 and 3 an embodiment of the imaging technique of the invention is explained.

The body 10 is subjected to multiple shots of a multi-echo imaging sequence as illustrated in FIG. 2. The imaging sequence is a modified multi-shot EPI sequence. The sequence comprises a slice-selective multi-slice RF pulse 21 for simultaneously exciting two or more spatially separate image slices. RF pulse 21 is radiated in the presence of a corresponding slice selection magnetic field gradient 22 in order to produce transverse nuclear magnetization in a number of imaging slices. Following excitation RF pulse 21 MR signals are acquired by sampling a series of gradient-recalled echo signals in the presence of an alternating readout magnetic field gradient 23. Phase-encoding of the MR signals is performed by a series of phase-encoding magnetic field gradient 'blips' 24. During the application of each phase encoding gradient blip 24, a further magnetic field gradient blip 25 is also applied in the slice-encoding direction. The slice encoding gradient blips 25 are used according to the invention to impart a phase offset to the MR signals of each image slice. While gradient blips 25 can be used to apply the different phase offsets the phase offsets can also be imparted by corresponding phasing of the slice-selective RF pulses 21 of the successive shots. The MR signal acquisition is accelerated by SENSE encoding. The MR signals are acquired in parallel via RF receiving coils 11, 12, 13 having different spatial sensitivities, and the MR signals are acquired with under-sampling in the phase-encoding direction. One single shot of the imaging sequence is depicted in FIG. 2. A plurality of (N) shots of the multi-echo sequence is applied for completely sampling k-space in order to be able to reconstruct full MR slice images from the acquired imaging echo signal data using SENSE reconstruction, wherein the phase offset imparted to the MR signals of the different is varied from shot to shot according to the invention. In other words, the $k_z$-phase encoding is varied from shot to shot and various ky-phsae encodings are made for each $k_z$-phase encoding. At each ($k_z$, $k_y$) position in k-space an entire $k_x$-line is sampled in the frequency encoding direction.

An MR image for each image slice is reconstructed from the acquired MR signal data using a parallel reconstruction algorithm, wherein the MR signal contributions from the different image slices are separated on the basis of the spatial encodings of the MR signals according to the spatial sensitivity profiles of the RF coils and on the basis of the phase offsets attributed to the respective image slices and shots. This is explained in more detail in the following:

In a multi-shot sequence with N shots, wherein each shot represents a regular under-sampling of k-space, a set of SENSE equations can be set up as:

$$S\vec{p} = \vec{m}_{sh}$$

Therein vector $\vec{p}$ comprises the image pixel values that need to be calculated from the aliased pixel values measured via the separate RF coils ('channels'). The aliased pixel values are described by vector $\vec{m}$. S is the coil sensitivity matrix which is determined by the spatial sensitivity profiles of the used RF coils. The size of the sensitivity matrix S is determined by the under-sampling of the shots, the number of used RF coils and the number of slices excited by the multi-slice RF pulses. The phase offset applied in each shot of the imaging sequence according to the invention can be taken into account by a matrix $\Phi_{sh}$ which is a diagonal matrix describing the resulting extra phase encoding in the slice direction. The SENSE equations can be written on this basis as:

$$S\Phi_{sh}\vec{p} = \vec{m}_{sh}$$

Herein $\Phi_{sh}$ is a diagonal matrix containing the phase encoding per location:

$$\Phi_{sh} = \begin{pmatrix} e^{\varphi(r_1)} & 0 & 0 \\ 0 & O & 0 \\ 0 & 0 & e^{\varphi(r_N)} \end{pmatrix}$$

Not only the different phase encodings in the slice direction ($k_z$) have to be taken into account, but also the different phase encodings in the phase-encoding direction ($k_y$) have to be considered. Hence, $\varphi(r)$ describes the phase imparted to the respective pixel values by both the phase encoding in the regular phase-encoding direction ($k_y$) and the phase offset in the slice direction ($k_z$). The coil sensitivity encoding and the phase encoding (y and z) can be combined into one encoding matrix $E_{sh}$:

$$S\Phi_{sh} = E_{sh}$$

Finally, the equations for all N shots can be combined in one generalized SENSE reconstruction kernel:

$$\begin{bmatrix} E_1 \\ M \\ E_N \end{bmatrix} \vec{p} = \begin{bmatrix} m_1 \\ M \\ m_N \end{bmatrix} \rightarrow E_{all}\vec{p} = \vec{m}_{all}$$

Therein $\vec{p}$ comprises the pixel values of all final slice images resulting from the multi-slice multi-shot SENSE reconstruction including phase encoding in the slice direction. The least squares solution (without noise de-correlation and regularization) of $\vec{p}$ is:

$$\vec{p} = (E_{all}^H E_{all})^{-1} E_{all} \vec{m}_{all}$$

The multi-slice acquisition approach of the invention can be regarded as a three-dimensional scan in which $k_y$-$k_z$ space is sampled by a corresponding phase-encoding, wherein the number of $k_z$ lines is equal to the number of simultaneously excited slices. With the multi-shot approach of the invention it becomes possible to acquire a given $k_y$ encoding step multiple times with different $k_z$ encodings. This makes it possible to optimally sample the three-dimensional k-space (using under-sampling). FIG. 3 illustrates an example of $k_y$-$k_z$-sampling according to the invention, wherein eight slices are simultaneously excited. Four shots A, B, C, and D of an EPI sequence are applied with four different phase offsets applied in the slice direction. Under-sampling is applied in both the $k_y$ and $k_z$ directions with interleaved sampling in the $k_g$-direction. In the depicted embodiment, each shot applies a constant $k_z$ encoding, such that no extra gradient blips need to be applied in the slice direction within the EPI sequence of a single shot.

The invention claimed is:

1. A method of magnetic resonance (MR) imaging of an object placed in an examination volume of a MR device, the method comprising: generating MR signals by subjecting the object to a number N of shots of a multi-echo imaging sequence comprising multi-slice RF pulses for simultaneously exciting two or more spatially separate image slices, with a phase offset being imparted to the MR signals of each image slice, wherein the phase offset is varied from shot to shot,
    acquiring the MR signals, wherein the MR signals are received in parallel via a set of at least two RF coils having different spatial sensitivity profiles within the examination volume, and
    reconstructing a MR image for each image slice from the acquired MR signals using a parallel reconstruction algorithm, wherein the MR signal contributions from the different image slices are separated on the basis of the spatial encodings of the MR signals according to the spatial sensitivity profiles of the RF coils and on the basis of the phase offsets attributed to the respective image slices and shots.

2. The method of claim 1, wherein k-space data under-sampled in a phase-encoding direction are acquired in each shot of the imaging sequence.

3. The method of claim 1, wherein k-space data undersampled in a phase-encoding direction imparted by the varying phase offsets are acquired in each shot of the imaging sequence.

4. The method of claim 1, wherein the phase offset is imparted by means of a phase modulation of the RF pulses.

5. The method of claim 1, wherein the phase offset is imparted by means of a magnetic field gradient applied in a slice-selection direction.

6. The method of claim 1, wherein an inverse problem of MR image reconstruction is solved using an encoding matrix, with matrix elements of the encoding matrix being determined by the spatial sensitivity profiles of the RF coils, k-space sampling of each shot of the imaging sequence, and the phase offsets attributed to the image slices and shots.

7. The method of claim 6, wherein a prior known phase errors of the MR signals are taken into account by incorporating the corresponding phase error values into the encoding matrix.

8. The method of claim 1 wherein a motion weighting based on motion information is applied in the MR image reconstruction.

9. The method of claim 8, wherein navigator signals are generated by subjecting the object to a navigator sequence between the shots of the imaging sequence, wherein the motion information is derived from the navigator signals.

10. The method of claim 6, wherein navigator signals are generated by subjecting the object to a navigator sequence, wherein motion-induced phase errors are taken into account by incorporating phase information derived from the navigator signals into the encoding matrix.

11. The method of claim 1, wherein a number M<N of shots of the imaging sequence is performed two or more times for the purpose of improving the signal-to-noise ratio.

12. A magnetic resonance (MR) device for carrying out the method of claim 1, wherein the MR device includes at least one main magnet coil for generating a uniform, static magnetic field within an examination volume, a number of gradient coils for generating switched magnetic field gradients in different spatial directions within the examination volume, a set of at least two RF coils having different spatial sensitivity profiles, a control unit for controlling temporal succession of RF pulses and switched magnetic field gradients, and a reconstruction unit, wherein the MR device is configured to:

generate MR signals by subjecting the object to a number N of shots of a multi-echo imaging sequence comprising multi-slice RF pulses for simultaneously exciting two or more spatially separate image slices, with a phase offset being imparted to the MR signals of each image slice, wherein the phase offset is varied from shot to shot, acquire the MR signals, wherein the MR signals are received in parallel via the set of RF coils, and reconstruct a MR image for each image slice from the acquired MR signals using a parallel reconstruction algorithm, wherein the MR signal contributions from the different image slices are separated on the basis of the spatial encodings of the MR signals according to the spatial sensitivity profiles of the RF coils and on the basis of the phase offsets attributed to the respective image slices and shots.

13. A computer program comprising executable instructions stored on a non-transitory computer readable storage medium, which when executed by a magnetic resonance (MR) device, causes the MR device to:

generate a number N of shots of a multi-echo imaging sequence comprising multi-slice RF pulses for simultaneously exciting two or more spatially separate image slices, with a phase offset being imparted to MR signals of each image slice, wherein the phase offset is varied from shot to shot, acquire the MR signals, and reconstruct a MR image for each image slice from the acquired MR signals using a parallel reconstruction algorithm, wherein the MR signal contributions from the different image slices are separated on the basis of the spatial encodings of the MR signals according to spatial sensitivity profiles of a set of at least two RF coils and on the basis of the phase offsets attributed to the respective image slices and shots.

* * * * *